United States Patent
Zhu et al.

(10) Patent No.: US 12,375,078 B2
(45) Date of Patent: Jul. 29, 2025

(54) SWITCH WITH GATE OR BODY CONNECTED LINEARIZER

(71) Applicant: SKYWORKS SOLUTIONS, INC., Irvine, CA (US)

(72) Inventors: Yu Zhu, Wellesley, MA (US); Oleksiy Klimashov, Burlington, MA (US); Jerod F. Mason, Bedford, MA (US); Hanching Fuh, Brookline, MA (US); Dylan Charles Bartle, Arlington, MA (US); Paul T. DiCarlo, Marlborough, MA (US)

(73) Assignee: Skyworks Solutions, Inc., Irvine, CA (US)

( * ) Notice: Subject to any disclaimer, the term of this patent is extended or adjusted under 35 U.S.C. 154(b) by 10 days.

(21) Appl. No.: 16/893,188

(22) Filed: Jun. 4, 2020

(65) Prior Publication Data

US 2020/0389166 A1 Dec. 10, 2020

Related U.S. Application Data

(60) Provisional application No. 62/857,415, filed on Jun. 5, 2019.

(51) Int. Cl.
*H03K 17/16* (2006.01)
*H03K 17/14* (2006.01)
*H03K 17/687* (2006.01)
*H04B 1/44* (2006.01)

(52) U.S. Cl.
CPC ......... *H03K 17/162* (2013.01); *H03K 17/145* (2013.01); *H03K 17/6871* (2013.01); *H04B 1/44* (2013.01)

(58) Field of Classification Search
CPC . H03K 17/162; H03K 17/145; H03K 17/6871
See application file for complete search history.

(56) References Cited

U.S. PATENT DOCUMENTS

| 8,975,947 | B1 * | 3/2015 | Seshita | H03K 17/162 |
| | | | | 327/379 |
| 9,948,252 | B1 * | 4/2018 | Adamski | H03F 1/0261 |
| 2011/0215795 | A1 * | 9/2011 | Hiraki | G11B 7/005 |
| | | | | 324/76.41 |
| 2015/0092892 | A1 * | 4/2015 | Yoshikawa | H03K 17/163 |
| | | | | 327/184 |
| 2016/0285449 | A1 * | 9/2016 | Yoo | H03K 17/693 |
| 2018/0041170 | A1 * | 2/2018 | Zhu | H03F 3/193 |
| 2018/0183431 | A1 | 6/2018 | Zhu et al. | |
| 2018/0337670 | A1 | 11/2018 | Zhu et al. | |
| 2020/0177133 | A1 * | 6/2020 | Elgani | H04L 27/06 |

\* cited by examiner

*Primary Examiner* — Patrick C Chen
(74) *Attorney, Agent, or Firm* — Chang & Hale LLP

(57) ABSTRACT

Circuits, systems, and methods to compensate for non-linearities associated with a switching circuit are discussed herein. For example, a switch circuit can include a switch arm and a linearizer arm. The switch arm can have a first transistor connected between an input node and an output node. The switch arm can be configured to receive a radio-frequency signal. The linearizer arm can have a second transistor connected to at least one of a gate or a body of the first transistor. The linearizer arm can be configured to compensate a non-linearity effect generated by the switch arm.

20 Claims, 14 Drawing Sheets

SWITCH WITH GATE OR BODY CONNECTED LINEARIZER

CROSS-REFERENCE TO RELATED APPLICATION(S)

This application claims priority to U.S. Provisional Application No. 62/857,415, filed Jun. 5, 2019 and entitled "Switch with Gate or Body Connected Linearizer," the entire contents of which are incorporated herein by reference.

BACKGROUND

Field

The present disclosure relates to radio-frequency switches.

Description of the Related Art

Communication devices often operate over a number of different communication bands and/or modes. To do so, the communication devices typically use one or more instances of transmit/receive circuitry to generate and amplify transmit signals and/or to amplify and process receive signals. The transmit/receive circuitry are connected to one or more antennas through switching circuitry, such as transistor switches. Even in cases where different antennas are used, multiple signals of different frequencies may nonetheless have a common signal path and pass through common switching circuitry at some location in a device. Non-linearities in circuitry may cause harmonic distortion and/or intermodulation distortion that make it a challenge to maintain isolation between multiple signals.

SUMMARY

In accordance with some implementations, the present disclosure relates to a radio-frequency switch comprising a switch arm and a linearizer arm. The switch arm has a first transistor connected between an input node and an output node. The switch arm is configured to receive a radio-frequency signal. The linearizer arm has a second transistor connected to at least one of a gate or a body of the first transistor. The linearizer arm is configured to compensate a non-linearity effect generated by the switch arm.

In some embodiments, a width of a gate of the first transistor is larger than a width of a gate of the second transistor. In some embodiments, a width of a gate of the first transistor is larger than 1 mm and a width of a gate of the second transistor is smaller than 10 µm.

In some embodiments, the switch arm includes a plurality of transistors connected in series to form a stack, and the linearizer arm is connected to each of the plurality of transistors. For example, the plurality of transistors can include at least ten transistors. In some embodiments, a width of a gate of the first transistor is based at least in part on a number of the plurality of transistors in the stack.

In some embodiments, the linearizer arm includes a resistor connected between the second transistor and the gate of the first transistor, the resistor has a resistance that is larger than a threshold.

In some embodiments, the linearizer arm is connected to the gate of the first transistor. The linearizer arm can include (i) a first biasing circuit connected to a gate of the second transistor and (ii) a second biasing circuit connected to a source of the second transistor, the linearizer arm being configured to control the first transistor to enable or disable passage of the radio-frequency signal from the input node to the output node. The linearizer arm can include at least one biasing circuit, the linearizer arm being configured to control the first transistor to enable or disable passage of the radio-frequency signal from the input node to the output node. In some embodiments, the linearizer arm is configured to enable passage of the radio-frequency signal from the input node to the output node by controlling, using the at least one biasing circuit, the second transistor to be in an on state. In some embodiments, the linearizer arm is configured to disable passage of the radio-frequency signal from the input node to the output node by controlling, using the at least one biasing circuit, the second transistor to be in an off state.

In some embodiments, the linearizer arm is configured to compensate the non-linearity effect generated by the switch arm by generating a first distortion product and the switch arm is configured to generate a second distortion product that is substantially opposite in phase to the first distortion product. The first distortion product and the second distortion product can each be a third-order distortion product.

In some embodiments, the linearizer arm is connected to the body of the first transistor. In some embodiments, the first transistor and the second transistor are each implemented as a field-effect transistor.

In some implementations, the present disclosure relates to a radio-frequency switch comprising an input node and an output node, a signal path including at least one transistor connected between the input node and the output node, and a linearizer arm including a transistor connected to at least one of a gate or a body of the at least one transistor in the signal path. The signal path is configured to receive a radio-frequency signal.

In some embodiments, a width of a gate of the at least one transistor in the signal path is larger than a width of a gate of the transistor in the linearizer arm.

In some embodiments, the linearizer arm is connected to the gate of the at least one transistor in the signal path and the linearizer arm is configured to control the at least one transistor in the signal path to enable or disable passage of the radio-frequency signal from the input node to the output node.

In some implementations, the present disclosure relates to a radio-frequency module comprising a packaging substrate to receive a plurality of components and a semiconductor die mounted on the packaging substrate. The semiconductor die includes a radio-frequency switch having a switch arm and a linearizer arm. The switch arm has a first transistor connected between an input node and an output node. The switch arm is configured to receive a radio-frequency signal. The linearizer arm has a second transistor connected to at least one of a gate or a body of the first transistor. The linearizer arm is configured to compensate a non-linearity effect generated by the switch arm.

In some implementations, the present disclosure relates to a radio-frequency device comprising a transceiver configured to generate a radio-frequency signal, a power amplifier connected to the transceiver and configured to generate an amplified radio-frequency signal, a switch connected to the power amplifier and configured to selectively route the amplified radio-frequency signal, and an antenna connected to the switch and configured to transmit the amplified radio-frequency signal. The switch has a switch arm and a linearizer arm. The switch arm has a first transistor connected between an input node and an output node. The switch arm is configured to receive the amplified radio-frequency signal. The linearizer arm has a second transistor connected to at least one of a gate or a body of the first transistor. The linearizer arm is configured to compensate a non-linearity effect generated by the switch arm.

For purposes of summarizing the disclosure, certain aspects, advantages, and/or features of the disclosure have been described. It is to be understood that not necessarily all such advantages may be achieved in accordance with any particular embodiment of the disclosure. Thus, the disclosure may be embodied or carried out in a manner that achieves or optimizes one advantage or group of advantages as taught herein without necessarily achieving other advantages as may be taught or suggested herein.

BRIEF DESCRIPTION OF THE DRAWINGS

Various embodiments are depicted in the accompanying drawings for illustrative purposes and should in no way be interpreted as limiting the scope of the disclosure. In addition, various features of different disclosed embodiments can be combined to form additional embodiments, which are part of this disclosure. Throughout the drawings, reference numbers may be reused to indicate correspondence between reference elements.

DETAILED DESCRIPTION

Non-linearities in a device frequently cause third-order intermodulation distortion (IMD3). Third-order intermodulation distortion is the measure of the third-order distortion products produced by a non-linear device when multiple signals closely spaced in frequency are fed into the device as input. At least some of these distortion products are usually so close to the original (desired) frequencies that it is difficult to filter out the distortion product, and thus, creates interference challenges in multichannel communication equipment.

This disclosure is directed to a switching circuit that includes one or more elements to compensate for non-linearities associated with the switching circuit. For example, the switching circuit can include a switch arm having a transistor that is controlled to selectively pass a signal from an input node to an output node. The switching circuit can also include a linearizer arm having a transistor that is connected to a gate or a body of the transistor of the switch arm. The linearizer arm can compensate for a non-linearity effect generated by the switch arm. For instance, the linearizer arm can generate a harmonic or intermodulation distortion to reduce or cancel out a harmonic or intermodulation distortion that is generated by the switch arm. This can reduce undesired distortion, such as third-order intermodulation distortion, third-order harmonics, and so on. Additionally, the switching circuit can improve signal isolation, reduce or minimize insertion loss, and/or provide a variety of other advantages.

Figure 1:
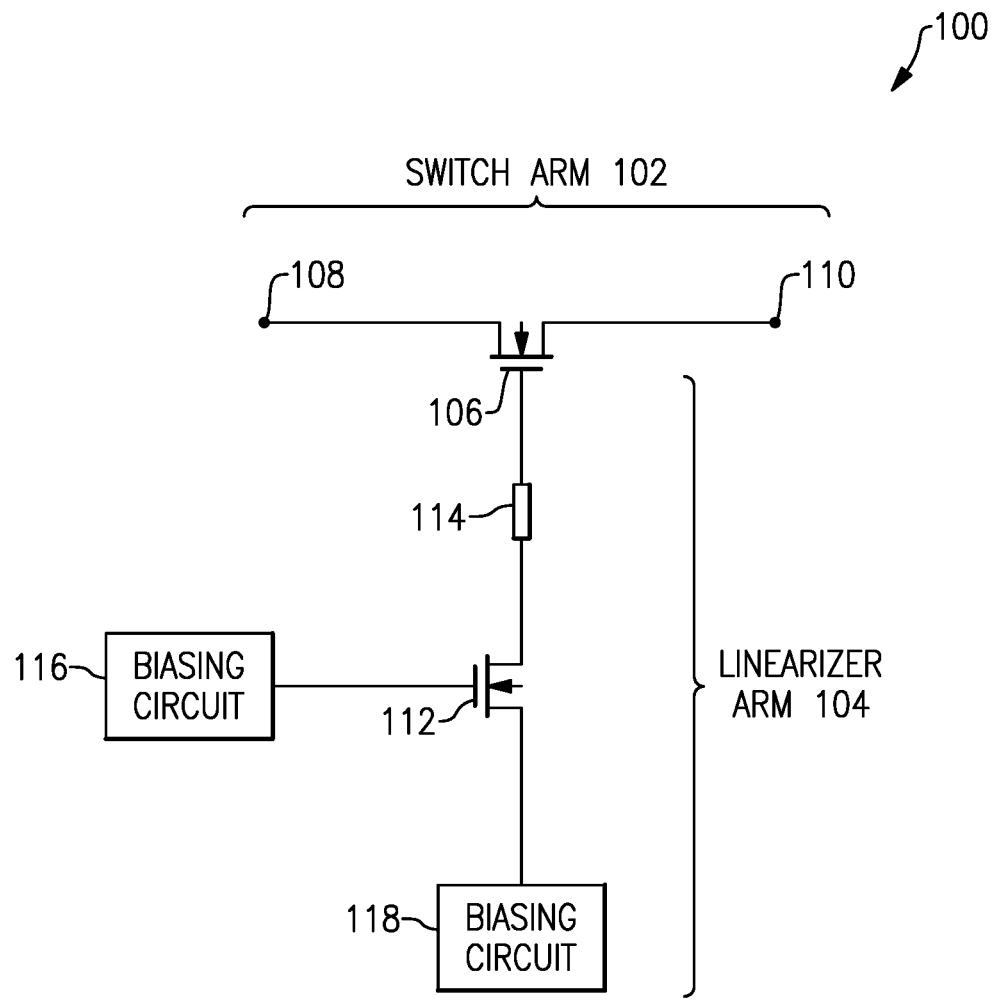
FIG. 1 illustrates an example switch with a linearizer arm electrically connected to a gate of a switch arm in accordance with one or more embodiments.

FIG. 1 illustrates an example switch 100 with a linearizer arm electrically connected to a gate of a switch arm. In particular, the switch 100 includes a switch arm 102 to control passage of a signal and a linearizer arm 104 to compensate for non-linearities generated by the switch arm 102. In examples, the linearizer arm 104 generates harmonic/intermodulation distortion with substantially opposite phase as harmonic/intermodulation distortion generated by the switch arm 102. As such, the linearizer arm 104 can reduce or cancel out harmonic and/or intermodulation distortion, as discussed in further detail in reference to FIG. 3, for example.

The switch arm 102 can include a transistor 106 electrically connected between an input node 108 and an output node 110. When the transistor 106 is in an ON state, the switch arm 102 can be configured in an ON state and pass a signal (e.g., a radio-frequency signal) received at the input node 108 to the output node 110. Here, the transistor 106 forms part of a conducting path from the input node 108 to the output node 110. The input node 108, the transistor 106, the output node 110, and/or conductive material used to connect the components can form a signal path. When the transistor 106 is in an OFF state, the switch arm 104 can be configured in an OFF state and prevent passage of a signal from the input node 108 to the output node 110.

The linearizer arm 104 can include a transistor 112 electrically connected to the transistor 106 of the switch arm 102. In the example of FIG. 1, the transistor 112 is electrically connected to the transistor 106 through a resistor 114. In examples, the resistor 114 has a relatively high resistance (e.g., a resistance that is larger than a threshold). For instance, a resistance of the resistor 114 can be equal to or more than 100 kOhms. Although the resistor 114 can have a different resistance or be eliminated in some cases.

Figure 2:
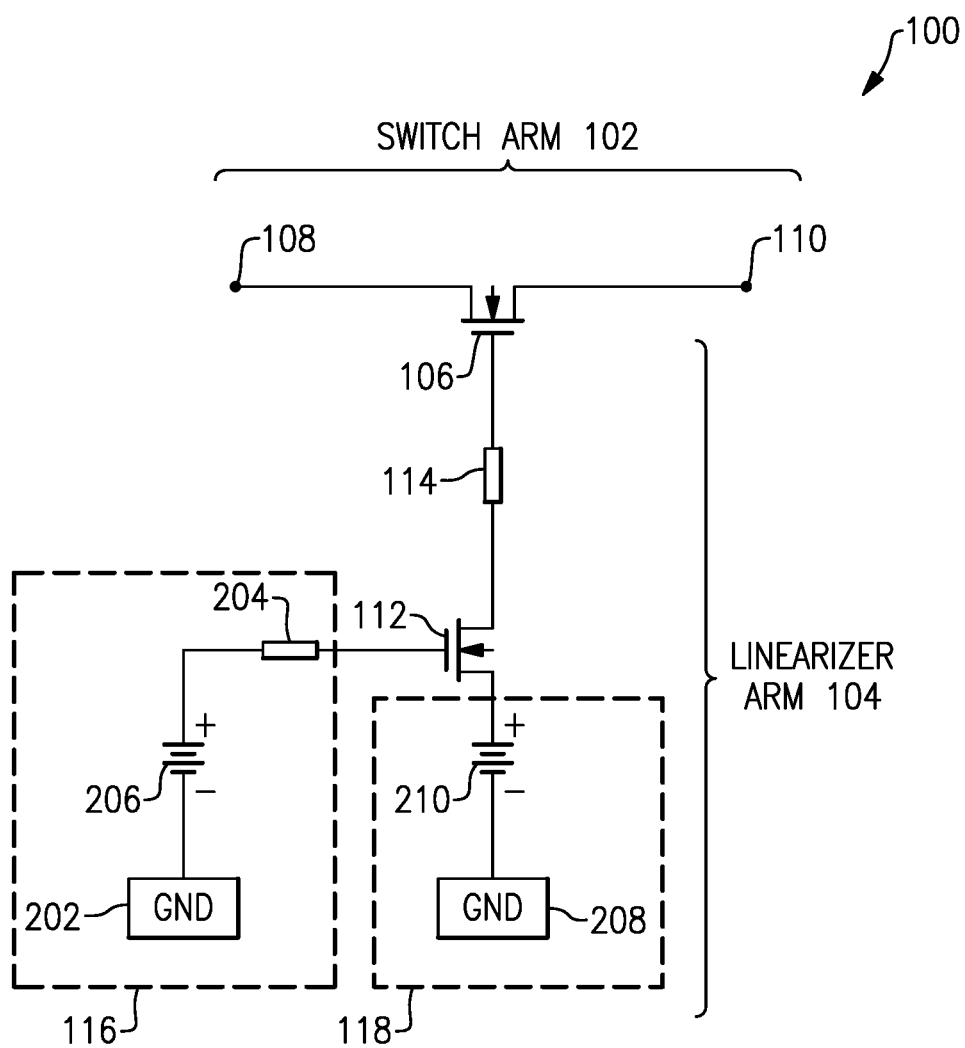
FIG. 2 illustrates the switch with example details of the biasing circuits of FIG. 1 in accordance with one or more embodiments.

The linearizer arm 104 can also include (i) a biasing circuit 116 electrically connected to a gate of the transistor 112 to bias the gate of the transistor 112 and (ii) a biasing circuit 118 electrically connected to a source of the transistor 112 to bias the source of the transistor 112. The biasing circuit 116 and/or the biasing circuit 118 can include a voltage source and/or a pad that is configured to connect to a voltage source. The biasing circuit 116 and/or the biasing circuit 118 can receive a control signal requesting that a bias voltage be applied to the transistor 112. Example biasing circuits 116 and 118 are illustrated in FIG. 2. Although not illustrated in FIG. 1, a biasing circuit can also be electrically connected to a body of the transistor 112 to bias the body of the transistor 112 and/or a biasing circuit can be electrically connected to a body of the transistor 106 to bias the body of the transistor 106.

In the example of FIG. 1, the linearizer arm 104 can control the switch arm 102 to enable or disable passage of a signal through the switch arm 102. To enable passage of the signal (e.g., place the switch arm 102 in an ON state), the biasing circuit 116 and/or the biasing circuit 118 can bias the transistor 112 to place the transistor 112 in an ON state. When the transistor 112 is in the ON state, a voltage applied by the biasing circuit 118 can be applied to the gate of the transistor 106 to place the transistor 106 in an ON state. This can allow a signal to pass through the switch arm 102 from the input node 108 to the output node 110. In some illustrations, to place the switch arm 102 in an ON state, the biasing circuit 116 applies 5 volts and the biasing circuit 118 applies 2.5 volts. However, other voltage amounts can be applied to meet other thresholds.

To disable passage of a signal through the switch arm 102 (e.g., place the switch arm 102 in an OFF state), the biasing circuit 116 and/or the biasing circuit 118 can bias the transistor 112 to place the transistor 112 in an OFF state. When the transistor 112 is in the OFF state, a voltage applied by the biasing circuit 118 is not applied to the gate of the transistor 106 and the transistor 106 is in an OFF state (e.g., 0 volts is applied to the gate of the transistor 106). This can prevent a signal from passing through the switch arm 102 from the input node 108 to the output node 110. In some instances, to place the switch arm 102 in an OFF state, the biasing circuit 116 applies 2.5 volts and the biasing circuit 118 applies −2.5 volts. However, other voltage amounts can be applied to meet other thresholds.

In examples, the transistor 106 is larger in size than the transistor 112. For instance, a width or length of a gate of the transistor 106 can be larger than a width or length of a gate of the transistor 112. To illustrate, a width of a gate of the transistor 106 can be equal to or larger than 1 mm, 2 mm, 3 mm, 5 mm, and so on. Meanwhile, a width of a gate of the transistor 112 can be equal to or smaller than 10 µm, 5 µm, 1.45 µm, 1 µm, and so on. In other examples, the transistor 106 is smaller in size than the transistor 112.

The transistor 106 and/or the transistor 112 can be implemented as a variety of types of transistors. For example, a transistor can include a field-effect transistor (FET) (e.g., N-type or P-type device), such as a junction FET (JFET), insulated gate FET (e.g., a metal-oxide-semiconductor FET (MOSFET), a complementary metal-oxide-semiconductor (CMOS), etc.), a silicon-on-insulator (SOI) FET, and so on. Further, a transistor can include a Bipolar junction transistor (BJT) (e.g., an NPN transistor, a PNP transistor, etc.), such as a heterojunction bipolar transistors (HBT), etc. The transistors 106 and 108 can be implemented as the same type of transistor or different types of transistors. In some examples, the transistor 106 and/or the transistor 112 can be implemented as a voltage-controlled switch, current-controlled switch, etc. For ease of illustration, many examples are shown with the transistors 106 and 108 implemented as FETs, particularly, N-type FETs.

In some examples, multiple transistors (in a stack) can be implemented in an arm segment of a device to enable improved power handling capability of the device. For example, a switch arm segment can include an increased number of FETs connected in series, an increased FET stack height, to enable improved device performance under high power. However, in some examples, increased FET stack height can degrade the switching device insertion loss performance.

Figure 10:
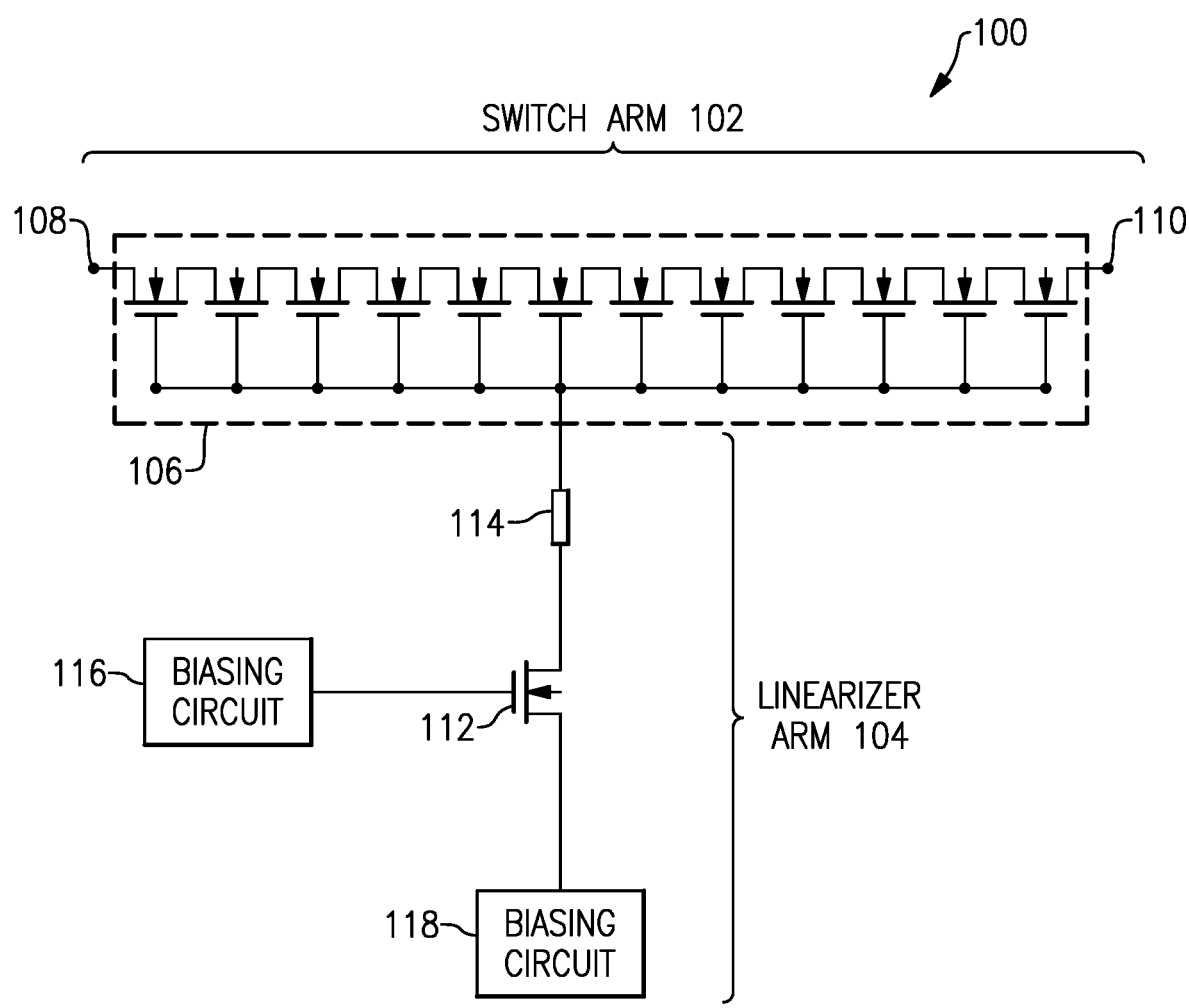
FIG. 10 illustrates an example of a switch with a transistor implemented as a transistor stack in accordance with one or more embodiments.

In examples, the transistor 106 is implemented as a transistor stack. A transistor stack can include a plurality of transistors connected in series. A number of transistors in a stack can be scaled based on power requirements of a switch, for example. An example implementation of a transistor stack is shown in FIG. 10. For ease of illustration, the transistor 106 is shown in many figures with a single device. However, it should be understood that the illustrated single device can represent one or more devices.

In examples, any component of a switch or a device in which the switch is implemented can have non-linear characteristics that contribute to the creation of distortion products. Distortion products can include harmonic distortion (HD) and/or intermodulation distortion (IMD). For instance, assume that an input signal with two frequency components ($f_1$ and $f_2$) is provided to a switch. The two frequency components can be separated by each other. Non-linearities in the switch and/or the device in which the switch is implemented can cause an output signal provided by the switch to include not only the original two frequency components, but additional frequency components at different frequencies, such as second-order harmonic distortion products (e.g., $2f_1$ and $2f_2$), second-order intermodulation products (e.g., $f_1+f_2$ and $f_2-f_1$), third-order harmonic distortion products (e.g., $3f_1$ and $3f_2$), third-order intermodulation products (e.g., $2f_1-f_2$ and $2f_2-f_1$), and so on.

In examples, second-order and third-order distortion products are of particular interest, since these distortion products are often relatively close to the original input frequency components. In general, as power levels decrease, the intermodulation distortion order number increases. To illustrate, when original frequency components $f_1$ and $f_2$ are relatively near each other in frequency (e.g., within a threshold amount), the third-order intermodulation products are also relatively nearby in frequency. This can make it difficult to filter out the third-order intermodulation products while retaining the original frequency components $f_1$ and $f_2$. Accordingly, it is valuable to reduce the generation of third-order harmonic and intermodulation products by reducing non-linearity characteristics of a device or switch rather than by attempting to remove the intermodulation products later. However, higher order products, such as fourth-order and fifth-order products, can also be of interest in some situations.

As such, the switch 100 discussed herein compensates for non-linearities produced by the switch 100 and/or a device in which the switch 100 is implemented. For example, as noted above, the switch 100 includes the linearizer arm 104 to compensate for distortion products, such as third-order intermodulation products, third-order harmonics, and so on.

FIG. 2 illustrates the switch 100 with example details of the biasing circuits 116 and 118 of FIG. 1. As shown, the biasing circuit 116 can include a ground pad 202, a resistor 204, and a voltage source 206 connected between the ground pad 202 and the resistor 204. The ground pad 202 can be configured to connect to a ground. The voltage source 206 is connected to a gate of the transistor 112 and is configured to apply a voltage to the gate of the transistor 112. The biasing circuit 118 can include a ground pad 208 and a voltage source 210 connected between the ground pad 208 and the source of the transistor 112. The voltage source 210 is configured to apply a voltage to the source of the transistor 112.

The voltage source 206 and/or the voltage source 210 operate to bias the transistor 210. For example, the voltage source 206 and/or the voltage source 210 can apply appropriate levels of voltage to place the transistor 112 in an ON or OFF state (e.g., apply voltages above or below thresholds). As such, the voltage source 206 and/or the voltage source 210 can be adjusted to change a state of the transistor 112 to thereby enable or disable a voltage to be applied to the transistor 106.

Although illustrated with as voltage sources, the voltage source 206 and/or the voltage source 210 can alternatively, or additionally, be implemented as voltage source pads configured to connect to voltage sources.

Figure 3:
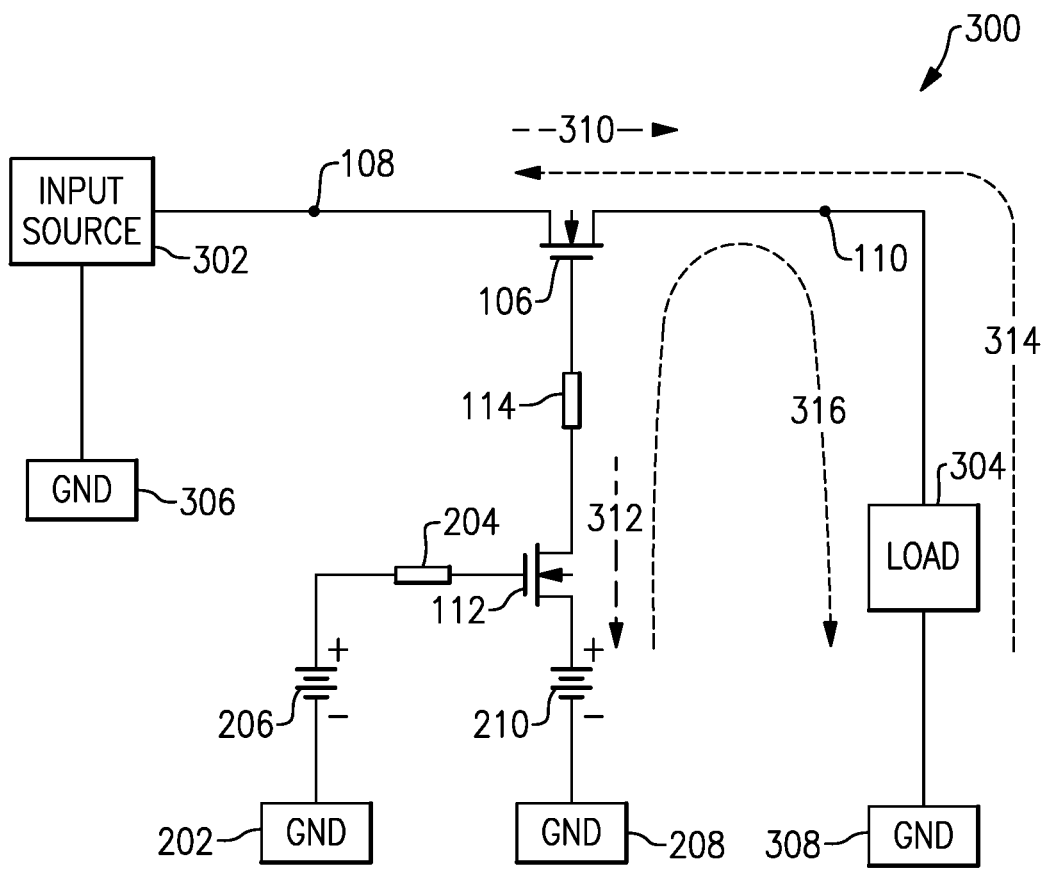
FIG. 3 illustrates a switch implemented within a system and example distortion that can be generated in accordance with one or more embodiments.

FIG. 3 illustrates the switch 100 implemented within a system 300 and example distortion that can be generated. As shown, the system 300 (e.g., a radio-frequency device or portion thereof) is connected to an input source 302 and a load 304. Here, the input source 302 is connected to a ground pad 306 and the load 304 is connected to a ground pad 308. In this example, distortion is illustrated at a point in time when an input signal is being provided by the input source 302 and when the switch arm 102 is in an ON state (e.g., the transistor 106 allows a signal to pass through the switch 100).

In FIG. 3, a line 310 illustrates the flow of current of the input signal (sometimes referred to as the fundamental signal) across the transistor 106. A line 312 illustrates the flow of current of the input signal across the transistor 112. A line 314 illustrates the flow of current of third-order harmonic/intermodulation distortion generated by the switch arm 102 (e.g., due to the transistor 106). A line 316 illustrates the flow of current of third-order harmonic/intermodulation distortion generated by the linearizer arm 104 (e.g., due to the transistor 112). As shown, the current of the third-order harmonic/intermodulation distortion from the switch arm 102 (the line 314) is opposite in direction to the current of the third-order harmonic/intermodulation distortion from the linearizer arm 104 (the line 316). As such, as seen by the load 304, the current of the third-order harmonic/intermodulation distortion generated by the linearizer arm 104 compensates or cancels out the current of the third-order harmonic/intermodulation distortion generated by the switch arm 102.

In examples, a size of the transistor 112 of the linearizer arm 104 is selected based on a parameter of the transistor 106 of the switch arm 102. This can allow the linearizer arm 104 to compensate or cancel out a majority or substantially all distortion generated by the switch arm 102. For example, a gate width of the transistor 112 can be based on a gate width of the transistor 106, a number of transistors that form the transistor 106 (e.g., a number of transistors in a stack), a power capacity of the transistor 106, a voltage capacity of the transistor 106, etc. In one illustration, if the transistor 106 is implemented as a transistor stack with many transistors, and the transistor stack generates a relatively large amount of third-order harmonic/intermodulation distortion, then a gate width of the transistor 112 can be selected that is relatively small (e.g., less than a threshold). Here, the relatively small transistor 112 is less linear, and thus, generates more third-order harmonic/intermodulation distortion to compensate or cancel out the relatively large amount of third-order harmonic/intermodulation distortion generated by the switch arm 102. In another illustration, if the transistor 106 is implemented as a transistor stack with relatively few transistors (e.g., in comparison to the illustration above), and the transistor stack generates relatively little third-order harmonic distortion, then a gate width of the transistor 112 can be selected to be relatively large. Here, the relatively large transistor 112 is more linear, and thus, generates less third-order harmonic/intermodulation distortion.

In one non-limiting example, the transistor 106 is implemented as a transistor stack of twelve transistors. Here, each transistor in the stack can have a gate width of 3 mm. In this example, the transistor 112 is implemented as a single transistor having a gate width of 1.45 μm. The transistor 112 can be connected to a gate of each of the transistors 106 in the stack. However, any number of transistors and/or any gate width can be used for the transistor 106 and/or the transistor 112.

Figure 4A:
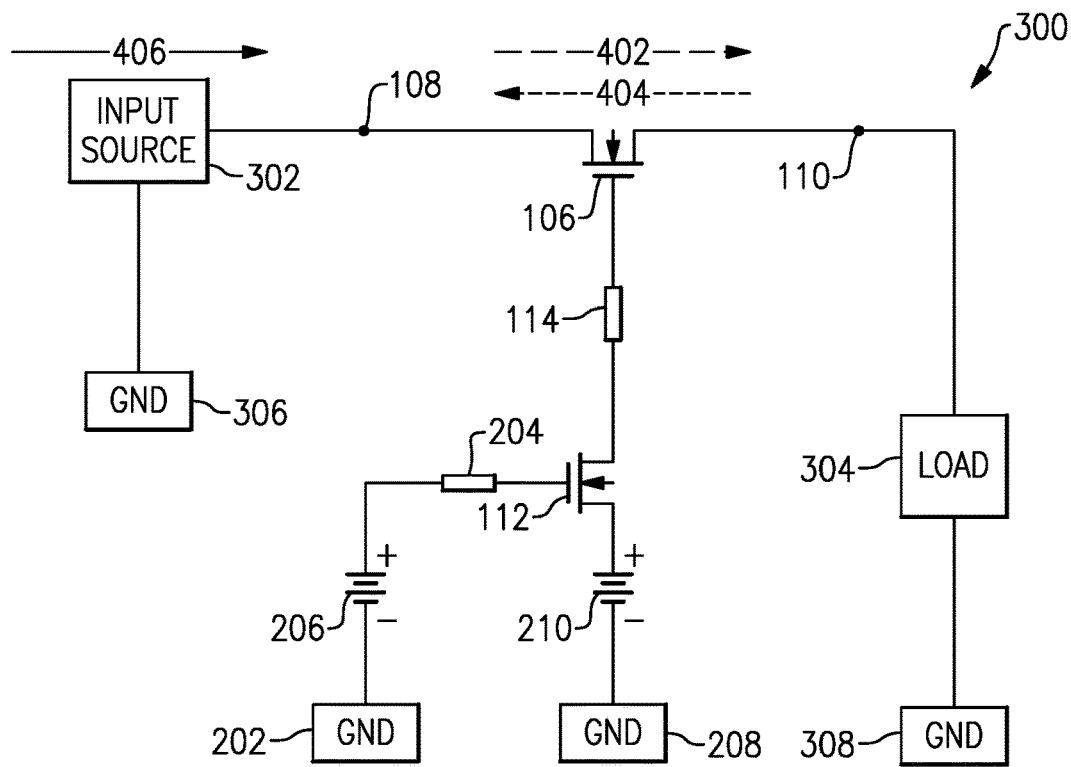
FIG. 4A illustrates example harmonic and intermodulation distortion with respect to a transistor when an input signal is provided by a system and a switch is in an ON state in accordance with one or more embodiments.

FIG. 4A illustrates example harmonic and intermodulation distortion with respect to the transistor 106 when an input signal is provided by the system 300 and the switch 100 is in an ON state. In this example, a line 402 illustrates the flow of current of the input signal (sometimes referred to as the fundamental signal) across the transistor 106. A line 404 illustrates the flow of current of the third-order harmonic/intermodulation distortion across the transistor 106. Further, a line 406 illustrates input current provided by the input source 302. In examples, the lines 402-406 are illustrative of a point in time for a signal (e.g., a radio-frequency signal at a specific time).

Figure 4B:
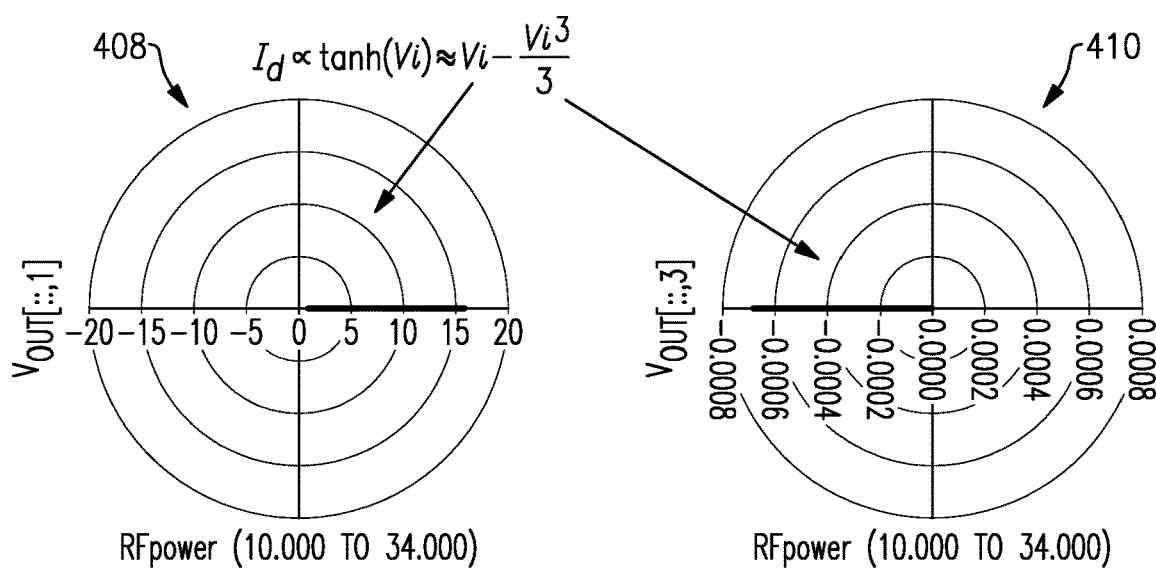
FIG. 4B illustrates phase and power of an input signal and third-order harmonic/intermodulation distortion associated with the example circuit of FIG. 4A in accordance with one or more embodiments.

FIG. 4B illustrates phase and power of the input signal and the third-order harmonic/intermodulation distortion. In particular, a graph 408 illustrates phase and a magnitude of power of the input signal (e.g., the line 402 of FIG. 4A), while a graph 410 illustrates a phase and a magnitude of power of third-order harmonic/intermodulation distortion (e.g., the line 404 of FIG. 4A). Here, when the phase of the input signal is at 0 degrees (as illustrated in the graph 408), the phase of the third-order harmonic/intermodulation distortion is opposite, at 180 degrees (as illustrated in the graph 410). Power is illustrated in FIG. 4B in dBm.

As shown, the magnitude of power of the input signal and the magnitude of power of the harmonic/intermodulation distortion can be represented with a hyperbolic tangent function and approximated with two terms. A first term (Vi) can be represented in the graph 408 and a second term (Vi³/3) can be represented in the graph 410. As illustrated, the second term has a negative sign. Thus, the second term is subtracted from the first term.

Although other signals and distortion are illustrated in FIG. 3 at other locations in the system 300, FIGS. 4A-4B illustrate a signal and distortion across the transistor 106 and the input source 302 to show the relative phase of the signal and distortion with respect to the transistor 106.

Figure 5A:
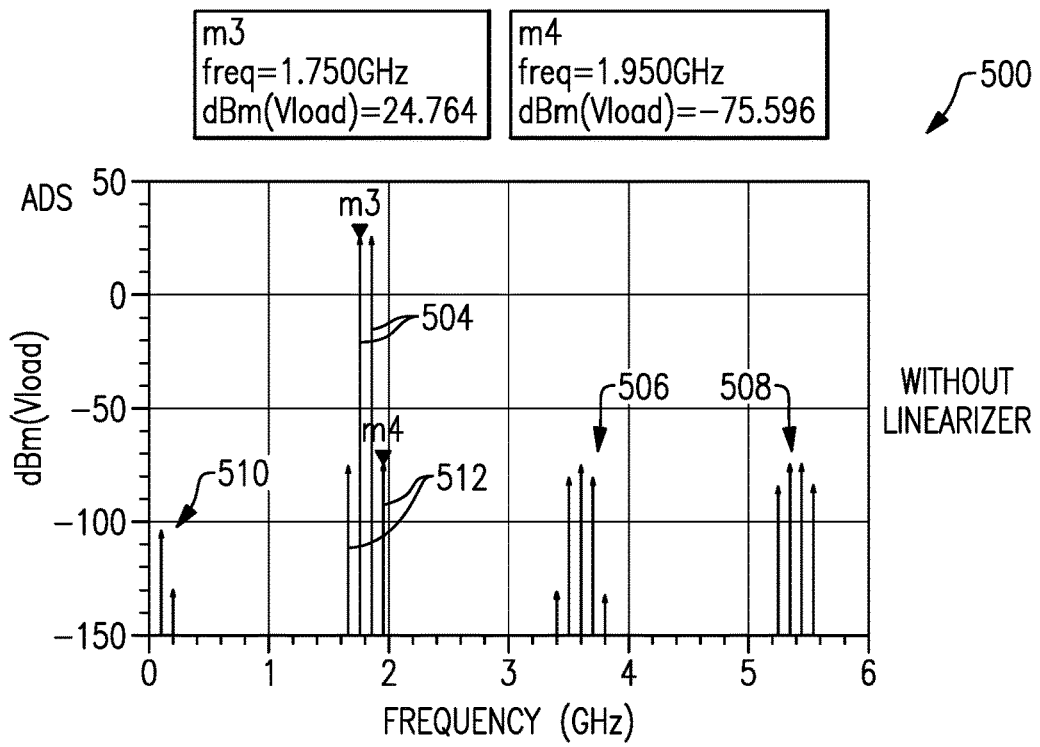
FIG. 5A illustrates an example frequency spectrum graph of output for an example system that does not include a linearizer in accordance with one or more embodiments.
Figure 5B:
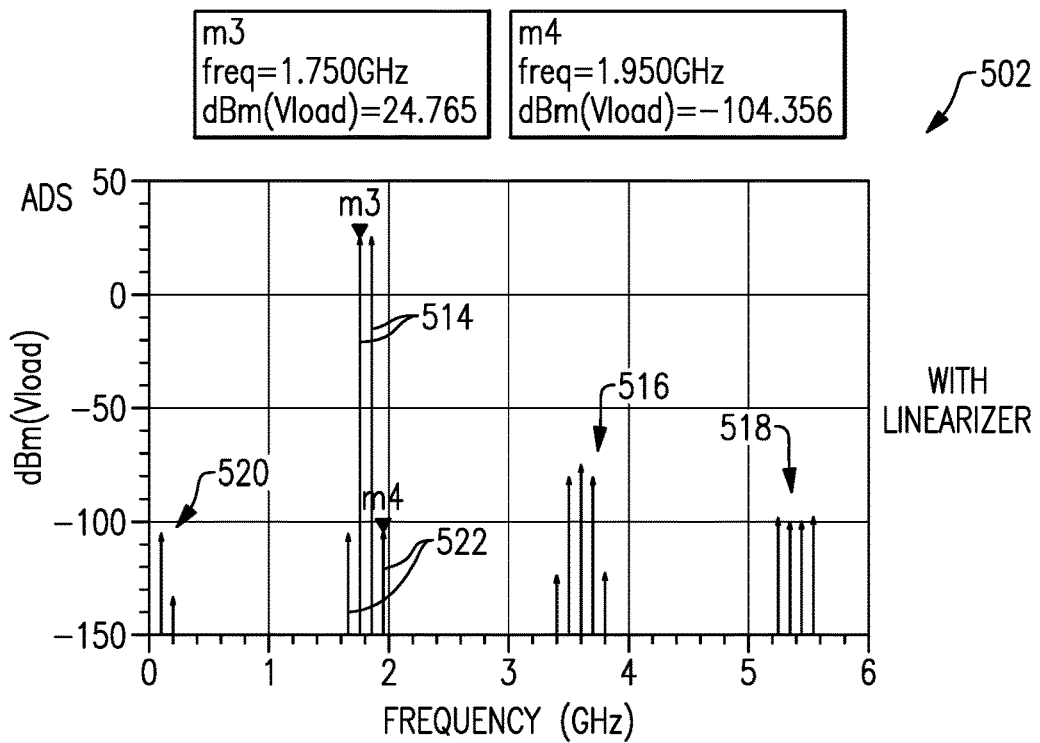
FIG. 5B illustrates an example frequency spectrum graph of output for an example system that includes a linearizer in accordance with one or more embodiments.

FIGS. 5A-5B illustrate example frequency spectrum graphs 500 and 502 of output signals from different systems. The graphs 500 and 502 show output voltage at a load in dBm with respect to frequency in GHz. In these examples, an input signal with two frequency components at 1.75 GHz and 1.85 GHz is provided into a system, and output signals are detected. The input signal with frequency components is also referred to as fundamental signals.

FIG. 5A illustrates the example frequency spectrum graph 500 of output for an example system that does not include the switch 100 (e.g., a system without a linearizer). The graph 500 shows output signals 504 for the fundamental signals. The output signals 504 have a signal strength of about 25 dBm. The graph 500 also shows second-order harmonic/intermodulation distortion products 506 generated by the system, third-order harmonic/intermodulation distortion products 508 generated by the system, and second-order harmonic/intermodulation distortion products 510 generated by the system. Further, the graph 500 shows third-order intermodulation products 512 that are relatively close to the output signals 504 for the fundamental signals. The third-order intermodulation products 512 have a signal strength of about −76 dBm.

FIG. 5B illustrates the example frequency spectrum graph 502 of output for an example system that includes the switch 100 (e.g., a system with a linearizer). The graph 502 shows output signals 514 for the fundamental signals. The output signals 514 have a signal strength of about 25 dBm. The graph 502 also shows second-order harmonic/intermodulation distortion products 516 generated by the system, third-order harmonic/intermodulation distortion products 518 generated by the system, and second-order harmonic/intermodulation distortion products 520 generated by the system. Further, the graph 502 shows third-order intermodulation products 522 that are relatively close to the output signals 514 for the fundamental signals. The third-order intermodulation products 514 have a signal strength of about −104 dBm.

As shown in FIGS. 5A and 5B, the third-order intermodulation distortion products 522 for the system with the linearizer are significantly less than the third-order intermodulation distortion products 512 for the system without the linearizer (e.g., by about 28 dBm). Further, the signal strength for the output signals 504 and 514 for the fundamental signals remains about the same (e.g., about 25 dBm). Other harmonic/intermodulation distortion products are also reduced with the linearizer, as illustrated by the difference in signal strength of the third-order harmonic/intermodulation products 508 and 518, for example. The signal strength for the second-order harmonic/intermodulation distortion products 506 and 516 remains about the same.

As such, in examples, the linearizers discussed herein can reduce a signal strength of distortion products, such as third-order harmonic/intermodulation distortion products. In some examples, improved switching device intermodulation distortion performance can be desirable for wireless communication devices operating in various wireless communication standards, such as the LTE communication standard. In some applications, it can be desirable to improve linearity of switching devices operating in wireless communication devices that enable simultaneous transmission of data and voice communication. For example, improved intermodulation distortion performance in switching devices can be desirable for wireless communication devices operating in the LTE communication standard and performing simultaneous transmission of voice and data communication (e.g., SVLTE).

In addition, in examples, the linearizers discussed herein can improve insertion loss. For example, a system with a linearizer can maintain about the same signal strength for an output signal of a fundamental signal as a system without a linearizer. Insertion loss can be a measure of attenuation of an RF signal that is routed through a device. For example, the magnitude of an RF signal at an output port of a switching device can be less than the magnitude of the RF signal at an input port of the switching device. Decreased insertion loss can be desirable to enable improved RF signal transmission.

Further, in examples, the linearizers discussed herein can allow a system to be implemented without a voltage buffer. A voltage buffer can include a stack of transistors that is connected to a switch (e.g., connected in parallel with a switch arm). When a switch is in an OFF state, a voltage buffer can absorb a majority of a voltage drop to protect other elements of a system.

Figure 6A:
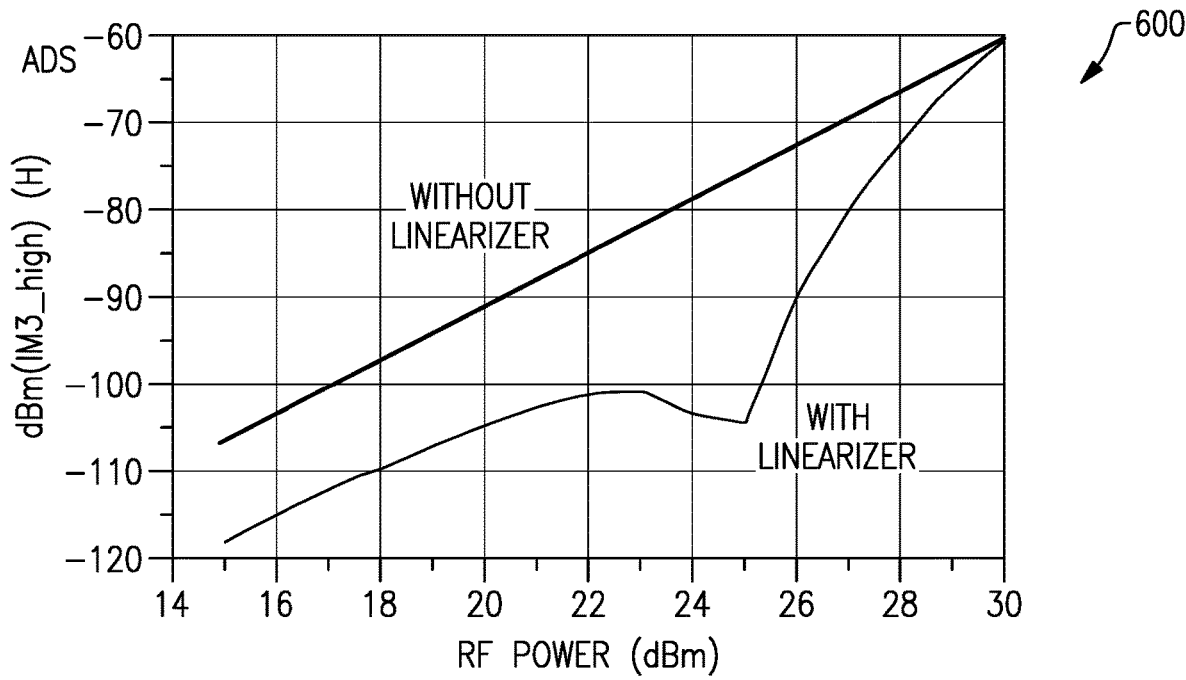
FIG. 6A illustrates an example plot of third-order harmonic/intermodulation distortion in dBm with respect to input power in dBm for systems with and without a linearizer in accordance with one or more embodiments.
Figure 6B:
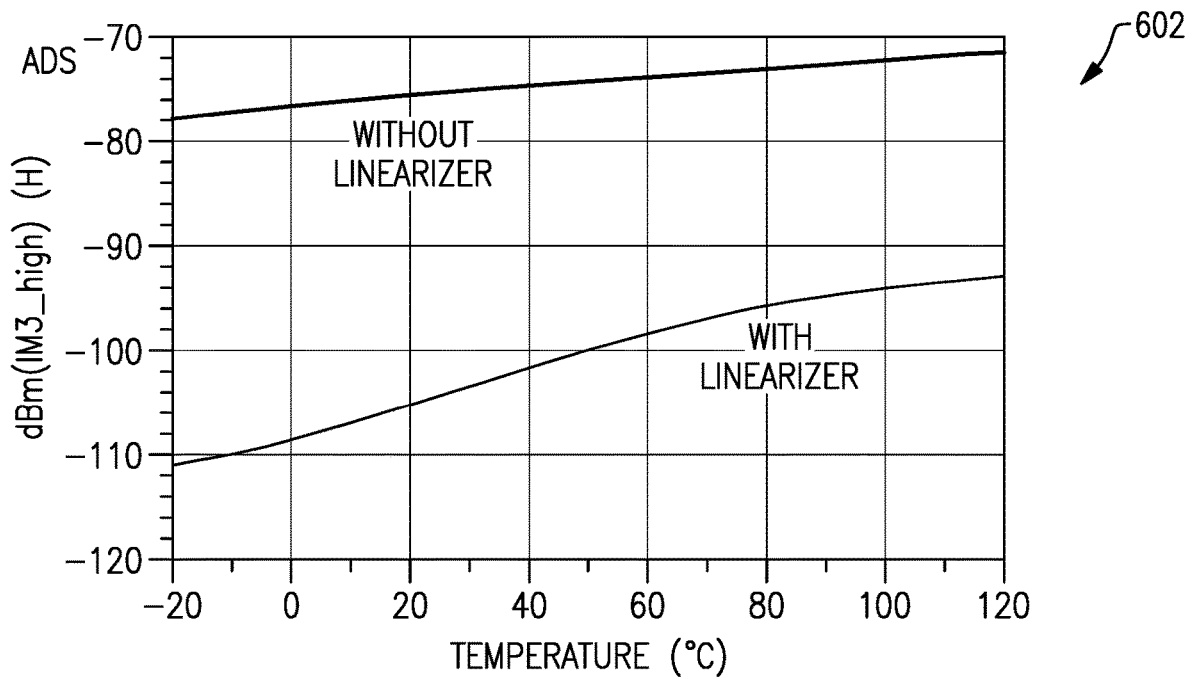
FIG. 6B illustrates an example plot of harmonic/intermodulation distortion in dBm with respect to operating temperature in degrees Celsius for systems with and without a linearizer in accordance with one or more embodiments.
Figure 6C:
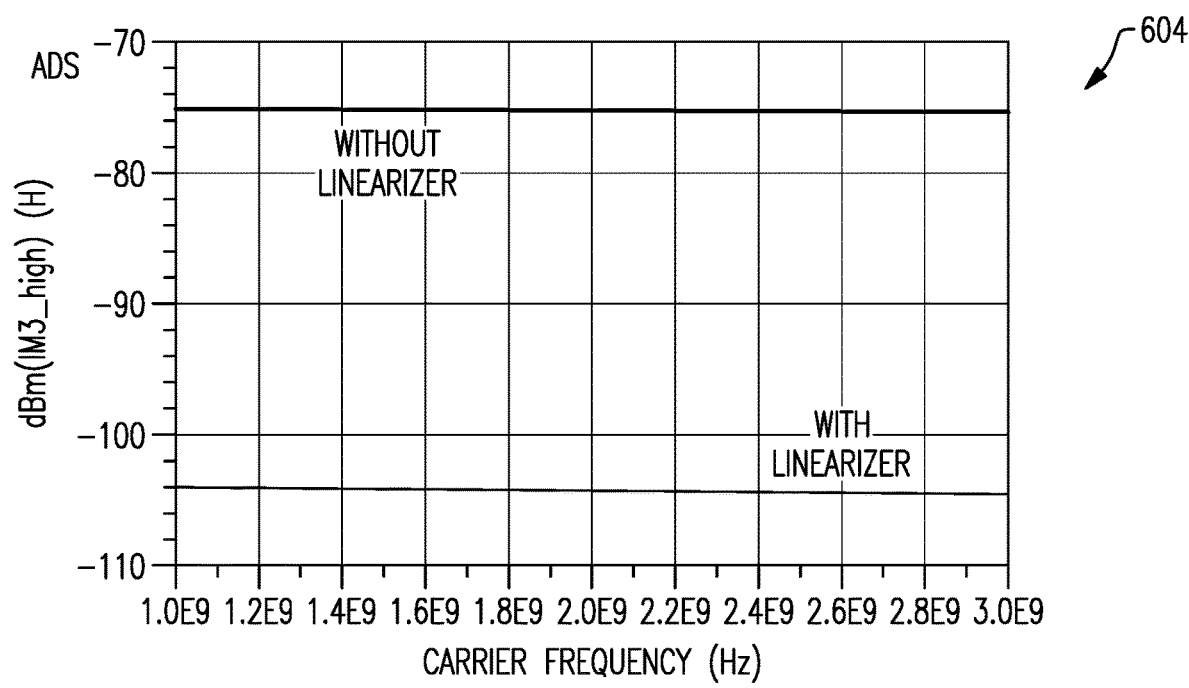
FIG. 6C illustrates an example plot of third-order harmonic/intermodulation distortion in dBm with respect to carrier frequency in Hz for systems with and without a linearizer in accordance with one or more embodiments.

FIGS. 6A-6C illustrate various plots 600, 602, and 604 of performance of an example system that includes the switch 100 ("with linearizer") and an example system that does not include the switch 100 ("without linearizer"). In examples, the systems are tailored to provide enhanced performance characteristics at about 25 dBm power, 50 ohms load resistance, and 1.8 GHz frequency. However, these operating points can be changed to provide enhanced performance characteristics at different powers, load resistances, and/or frequencies. The plots 600-604 illustrate that the linearizers discussed herein (e.g., the linearizer arm 104) can improve the operation of switches over a wide range of input power, operating temperature, carrier frequency, and so on.

In particular, FIG. 6A illustrates the example plot 600 of third-order harmonic/intermodulation distortion in dBm with respect to input power in dBm. As shown, the largest improvement with the linearizer is at about 25 dBm in power. FIG. 6B illustrates the example plot 602 of harmonic/intermodulation distortion in dBm with respect to operating temperature in degrees Celsius. FIG. 6C illustrates the example plot 604 of third-order harmonic/intermodulation distortion in dBm with respect to carrier frequency in Hz.

Figure 7:
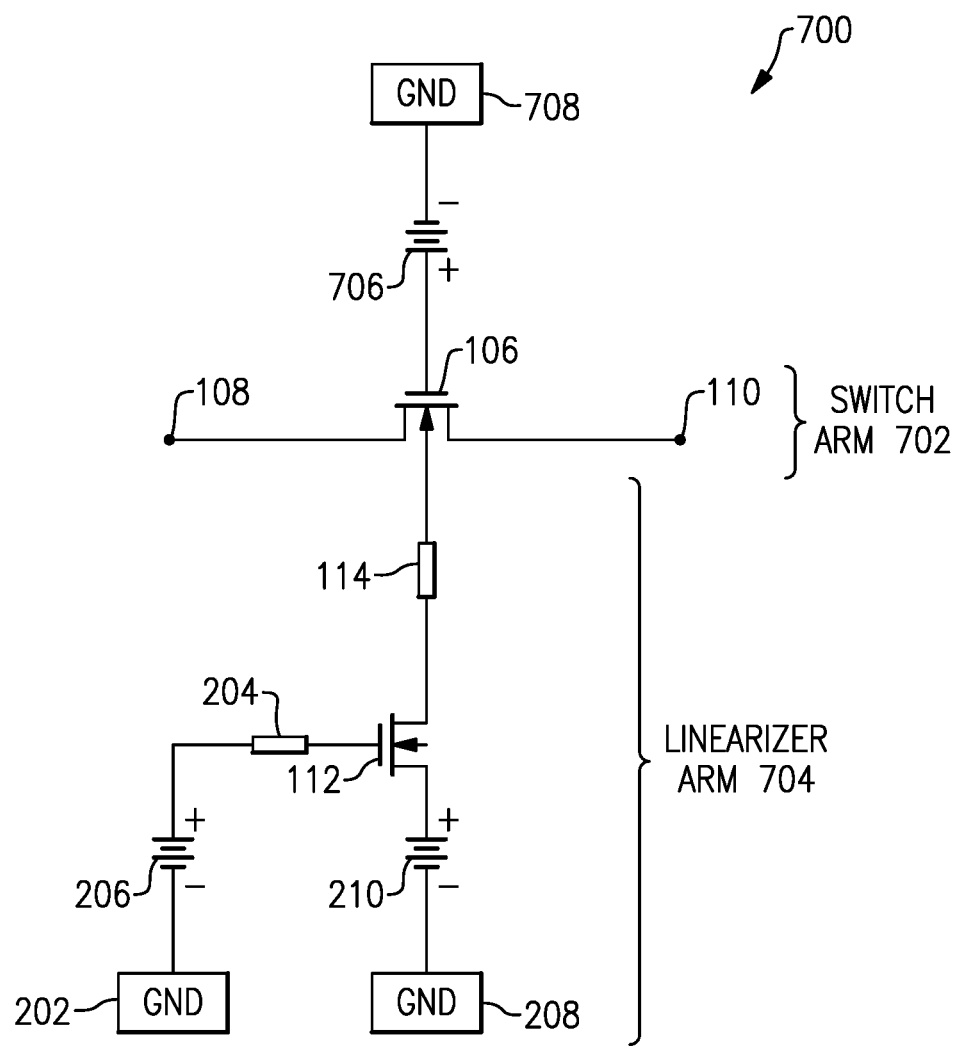
FIG. 7 illustrates an example switch with a linearizer arm connected to a body of a switch arm in accordance with one or more embodiments.

FIG. 7 illustrates an example switch 700 with a linearizer arm connected to a body of a switch arm. In particular, the switch 700 includes a switch arm 702 to control passage of a signal and a linearizer arm 704 to compensate for non-linearities generated by the switch arm 702. In examples, the linearizer arm 704 generates harmonic/intermodulation distortion with substantially opposite phase as harmonic/intermodulation distortion generated by the switch arm 702.

As illustrated, the switch 700 includes many components of the switch 100, except that the linearizer arm 704 is connected to a body of the transistor 106 instead of being connected to a gate of the transistor 106. Further, the switch 700 includes a voltage source 706 connected between a ground pad 708 and a gate of the transistor 106. The voltage source 706 is configured to bias the transistor 106. The voltage source 706 and/or the voltage source 210 can apply an appropriate level of voltage to the transistor 106 to place the transistor 106 in an ON or OFF state (e.g., apply a voltage above or below a threshold). As such, the voltage source 706 and/or the voltage source 210 can enable or disable passage of a signal through the switch arm 702 (e.g., from the input node 108 to the output node 110).

In examples, to enable passage of a signal through the switch arm 702 (e.g., to place the switch arm 702 in an ON state), the voltage source 206 applies 2.5 volts to the gate of the transistor 112 and the voltage source 210 applies 0 volts to the source of the transistor 112. This places the transistor 112 in an ON state, and the 0 volts from the voltage source 210 is then applied to the body of the transistor 106. The voltage source 706 also applies an appropriate level of voltage (e.g., more than a threshold) to a gate of the transistor 106 to place the transistor 106 in an ON state. However, other voltage amounts can be applied to meet other thresholds.

In examples, to disable passage of a signal through the switch arm 702 (e.g., to place the switch arm 702 in an OFF state), the voltage source 206 applies 0 volts to the gate of the transistor 112 and the voltage source 210 applies −2.5 volts to the source of the transistor 112. This places the transistor 112 in an ON state, and the −2.5 volts from the voltage source 210 is then applied to the body of the transistor 106. The voltage source 706 also applies an appropriate level of voltage (e.g., less than a threshold) to a gate of the transistor 106 to place the transistor 106 in an OFF state. However, other voltage amounts can be applied to meet other thresholds.

Figure 8A:
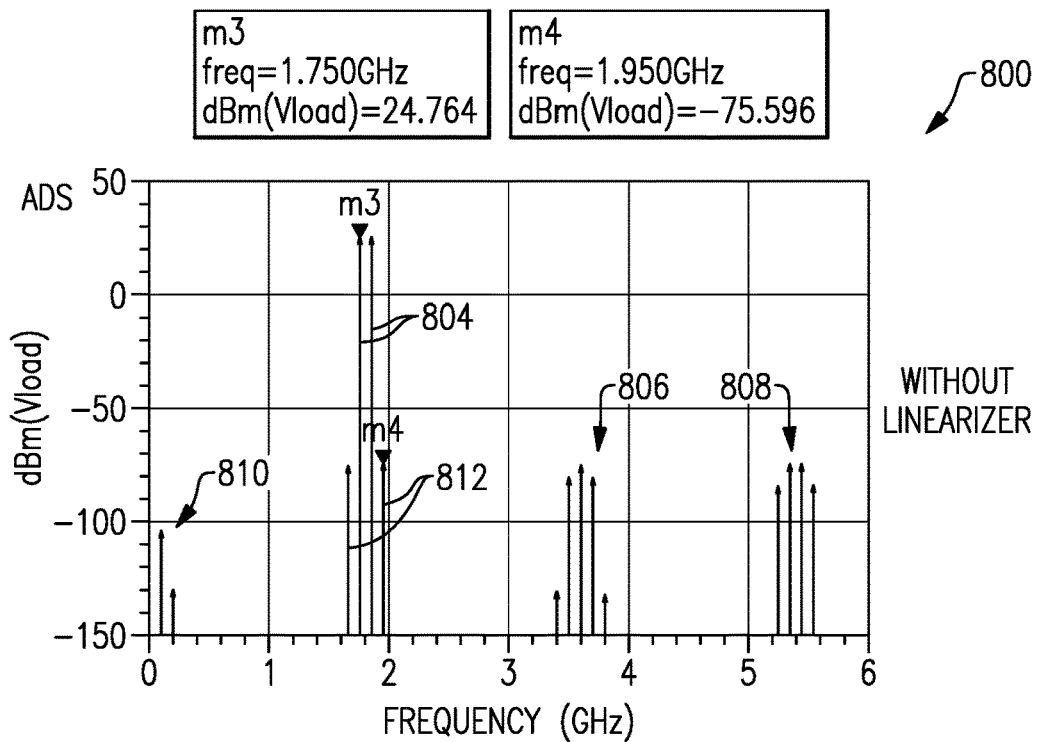
FIG. 8A illustrates an example frequency spectrum graph of output for an example system that does not include a linearizer in accordance with one or more embodiments.
Figure 8B:
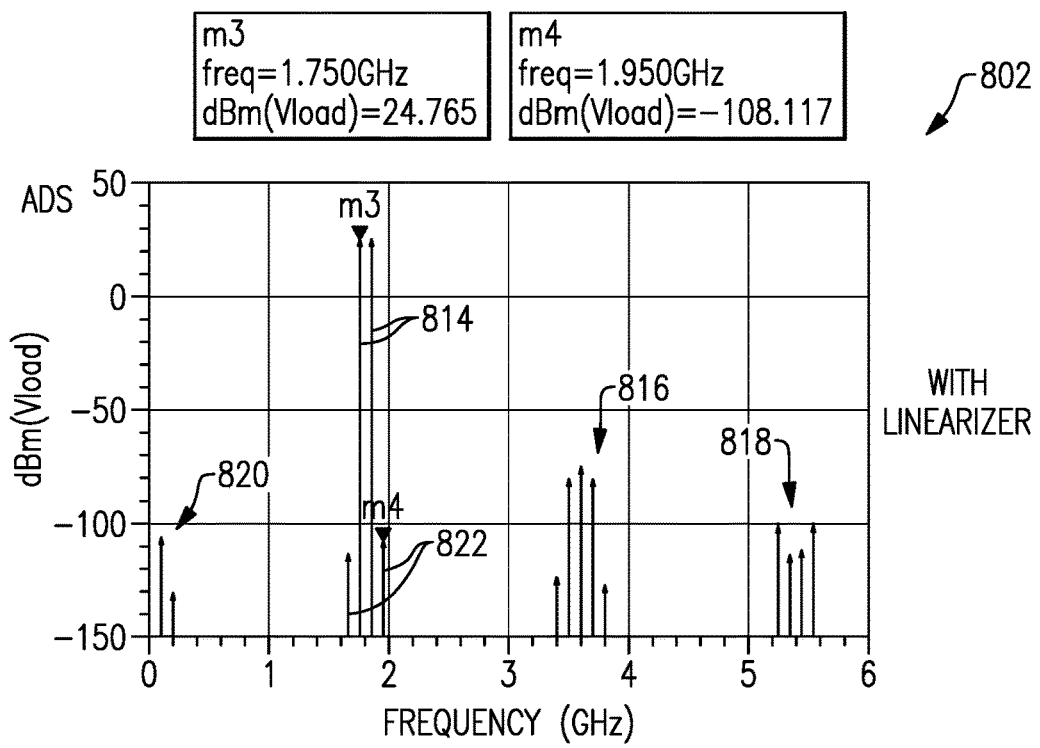
FIG. 8B illustrates an example frequency spectrum graph of output for an example system that includes a linearizer in accordance with one or more embodiments.

FIG. 8A-8B illustrate example frequency spectrum graphs 800 and 802 of output signals from different systems. The graphs 800 and 802 show output voltage at a load in dBm with respect to frequency in GHz. In these examples, an input signal with two frequency components at 1.75 GHz and 1.85 GHz is provided into a system, and output signals are detected. The input signal with frequency components is also referred to as fundamental signals.

FIG. 8A illustrates the example frequency spectrum graph 800 of output for an example system that does not include the switch 700 (e.g., a system without a linearizer). The graph 800 shows output signals 804 for the fundamental signals. The output signals 804 have a signal strength of about 25 dBm. The graph 800 also shows second-order harmonic/intermodulation distortion products 806 generated by the system, third-order harmonic/intermodulation distortion products 808 generated by the system, and second-order harmonic/intermodulation distortion products 810 generated by the system. Further, the graph 800 shows third-order intermodulation products 812 that are relatively close to the output signals 804 for the fundamental signals. The third-order intermodulation products 812 have a signal strength of about −76 dBm.

FIG. 8B illustrates the example frequency spectrum graph 802 of output for an example system that includes the switch 700 (e.g., a system with a linearizer). The graph 802 shows output signals 814 for the fundamental signals. The output signals 814 have a signal strength of about 25 dBm. The graph 802 also shows second-order harmonic/intermodulation distortion products 816 generated by the system, third-order harmonic/intermodulation distortion products 818 generated by the system, and second-order harmonic/intermodulation distortion products 820 generated by the system. Further, the graph 802 shows third-order intermodulation products 822 that are relatively close to the output signals 814 of the fundamental signals. The third-order intermodulation products 822 have a signal strength of about −108 dBm.

As shown in FIGS. 8A and 8B, the third-order intermodulation distortion products 822 for the system with the linearizer are significantly less than the third-order intermodulation distortion products 812 for the system without the linearizer (e.g., by about 32 dBm). Further, the signal strength for the output signals 804 and 814 of the fundamental signals remains about the same (e.g., about 25 dBm). Other harmonic/intermodulation distortion products are also reduced with the linearizer, as illustrated by the difference in signal strength of the third-order harmonic/intermodulation products 808 and 818, for example. In addition, the signal strength for the second-order harmonic/intermodulation distortion products 806 and 816 remains about the same. As such, the system with the linearizer can reduce a signal strength of distortion products, such as third-order harmonic/intermodulation distortion products, while maintaining the same signal strength of output signals of fundamental signals. Thus, the system with the linearizer experiences no insertion loss (or very minimal) due to the insertion of the linearizer.

Figure 9A:
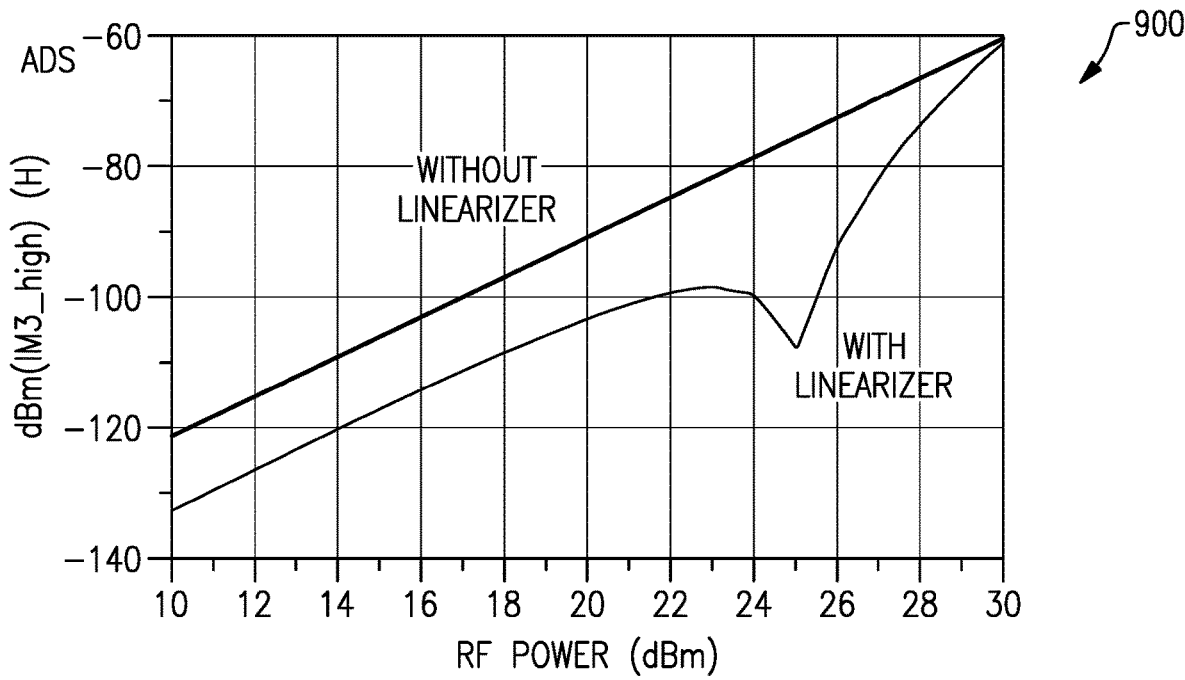
FIG. 9A illustrates an example plot of third-order harmonic/intermodulation distortion in dBm with respect to input power for systems with and without a linearizer in dBm in accordance with one or more embodiments.
Figure 9B:
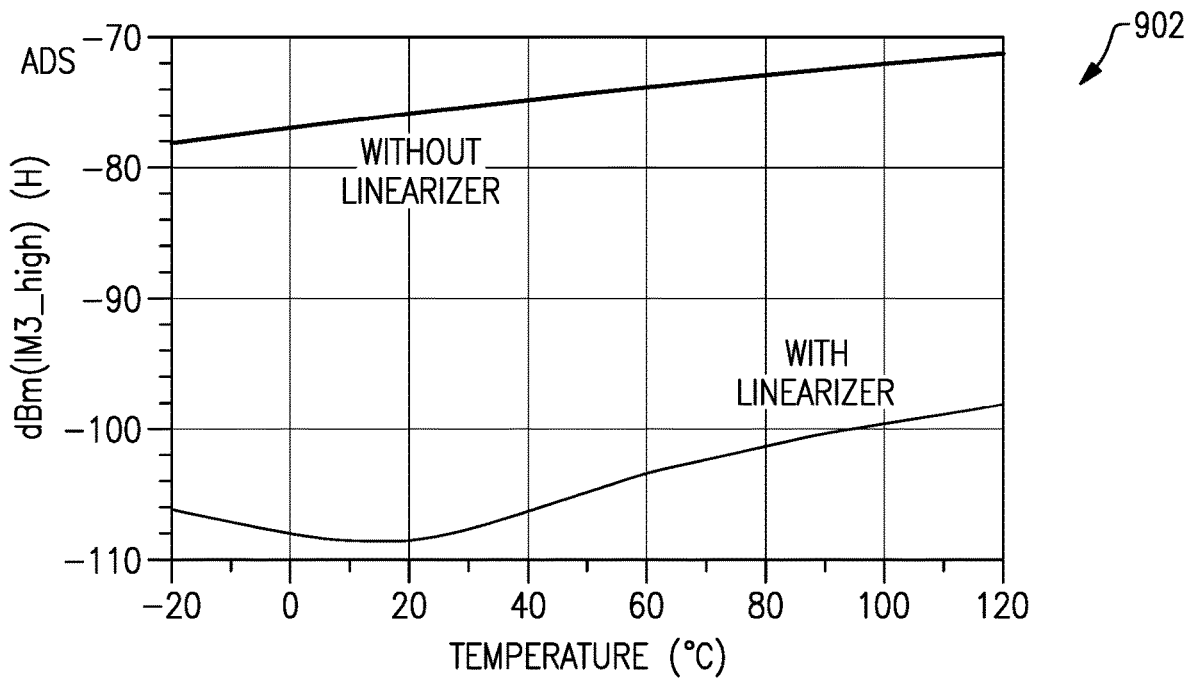
FIG. 9B illustrates an example plot of harmonic/intermodulation distortion in dBm with respect to operating temperature in degrees Celsius for systems with and without a linearizer in accordance with one or more embodiments.
Figure 9C:
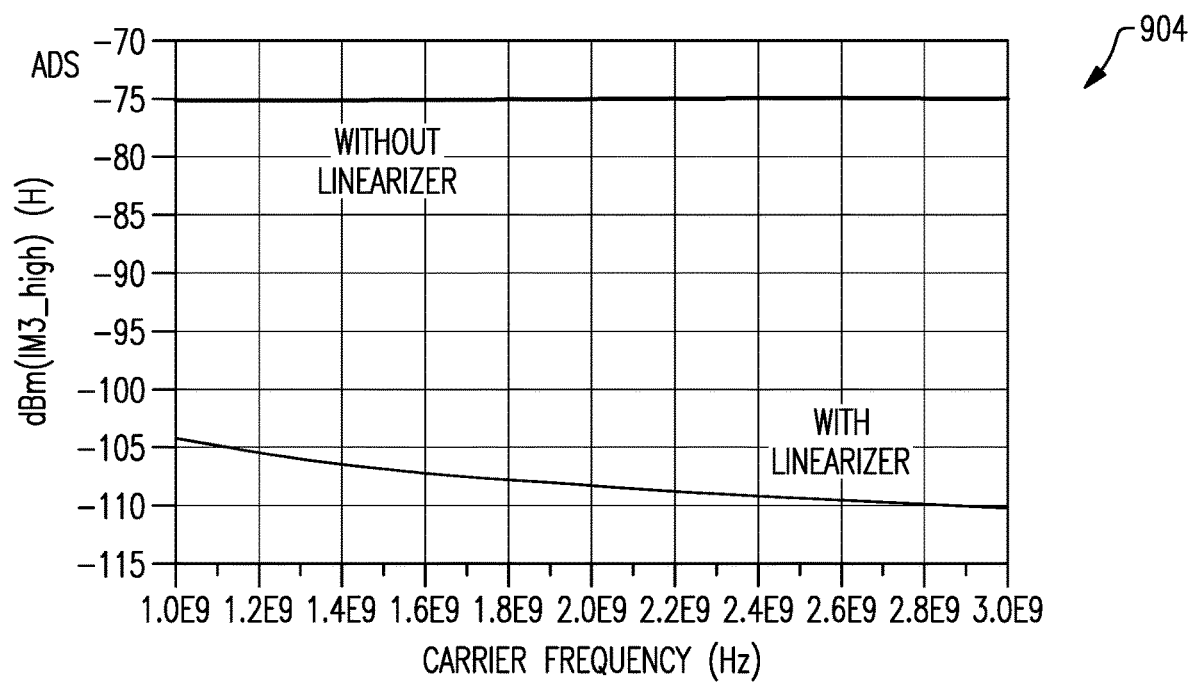
FIG. 9C illustrates an example plot of third-order harmonic/intermodulation distortion in dBm with respect to carrier frequency for systems with and without a linearizer in Hz in accordance with one or more embodiments.

FIGS. 9A-9C illustrate various plots 900, 902, and 904 of performance of an example system that includes the switch 700 ("with linearizer") and an example system that does not include the switch 700 ("without linearizer"). In examples, the systems are tailored to provide enhanced performance characteristics at about 25 dBm power, 50 ohms load resistance, and 1.8 GHz frequency. However, these operating points can be changed to provide enhanced performance characteristics at different powers, load resistances, and/or frequencies. The plots 900-904 illustrate that the linearizer (e.g., the linearizer arm 704) discussed herein can improve the operation of switches over a wide range of input power, operating temperature, carrier frequency, and so on.

In particular, FIG. 9A illustrates the example plot 900 of third-order harmonic/intermodulation distortion in dBm with respect to input power in dBm. As shown, the largest improvement with the linearizer is at about 25 dBm in power. FIG. 9B illustrates the example plot 902 of harmonic/intermodulation distortion in dBm with respect to operating temperature in degrees Celsius. FIG. 9C illustrates the example plot 904 of third-order harmonic/intermodulation distortion in dBm with respect to carrier frequency in Hz.

Although many examples are discussed with a linearizer arm connected to a gate or body of a transistor of a switch arm, in some examples a linearizer arm discussed herein can be connected at other locations, such as to a drain or source of a transistor of a switch arm.

FIG. 10 illustrates an example of the switch 100 with the transistor 106 implemented as a transistor stack. The transistor stack 106 includes multiple transistors connected in series. In this example, the linearizer arm 104 is connected to a gate of each of the transistors in the transistor stack 106. In other examples, the linearizer arm 104 can be connected to a body of each of the transistors in the transistor stack 106. Although twelve transistors are shown in this example, any number of transistors can be used for a transistor stack.

Figure 11:
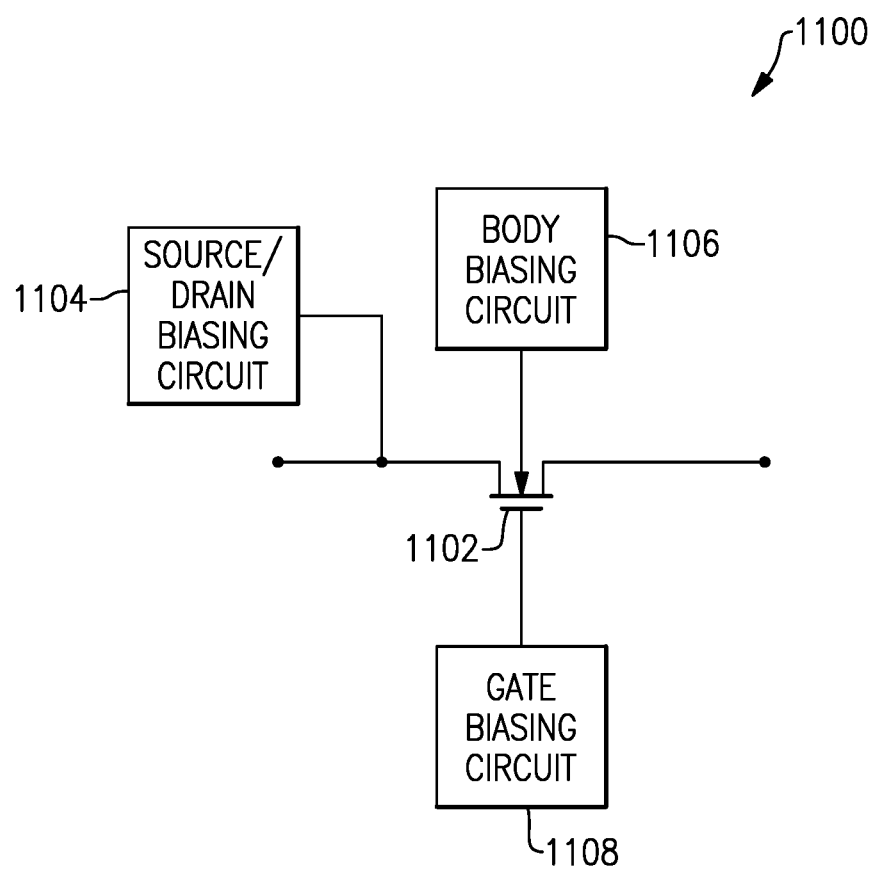
FIG. 11 illustrates example biasing of a transistor in accordance with one or more embodiments.

FIG. 11 illustrates example biasing 1100 of a transistor 1102. In this example, the transistor 1102 is connected to a source/drain biasing circuit 1104 that applies a biasing voltage to a source or drain of the transistor 1102, a body biasing circuit 1106 that applies a biasing voltage to a body of the transistor 1102, and a gate biasing circuit 1108 that applies a biasing voltage to a gate of the transistor 1102. The source/drain biasing circuit 1104, the body biasing circuit

1106, and/or the gate biasing circuit 1108 can apply voltages that are more or less than a value to control the transistor 1102 (e.g., place the transistor an in ON or OFF state).

In examples, the transistor 1102 can be representative of any of the transistors discussed herein. That is, any of the transistors discussed herein can be biased in a similar manner as that of the example biasing 1100 of the transistor 1102. As such, although not illustrated in some cases, any of the transistors discussed herein can be connected to any number of biasing circuits to control the transistors.

Figure 12:
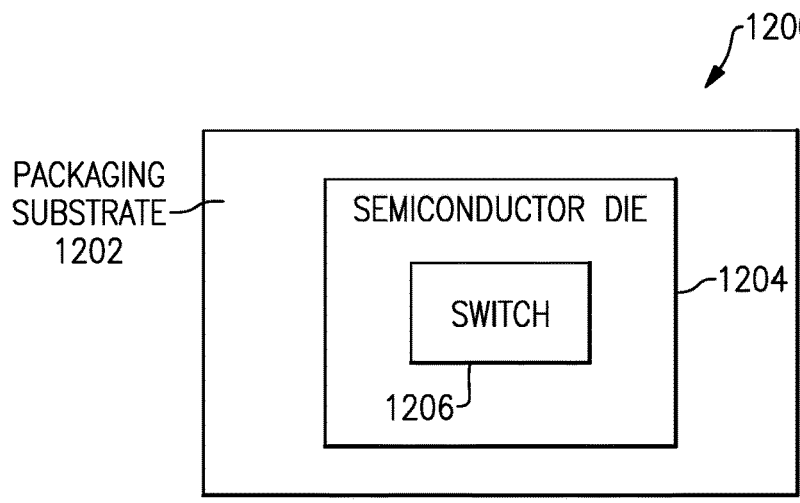
FIG. 12 illustrates an example radio-frequency module in accordance with one or more embodiments.

FIG. 12 illustrates an example radio-frequency module 1200. The radio-frequency module 1200 includes a packaging substrate 1202, a semiconductor die 1204 mounted on the packaging substrate 1202, and a switch 1206 implemented on the semiconductor die 1204. In some examples, the radio-frequency module 1200 can be a front-end module (FEM). The radio-frequency module 1200 can facilitate, for example, multi-band, multi-mode operation of a radio-frequency device. The switch 1206 can include any of the switches discussed herein.

Figure 13:
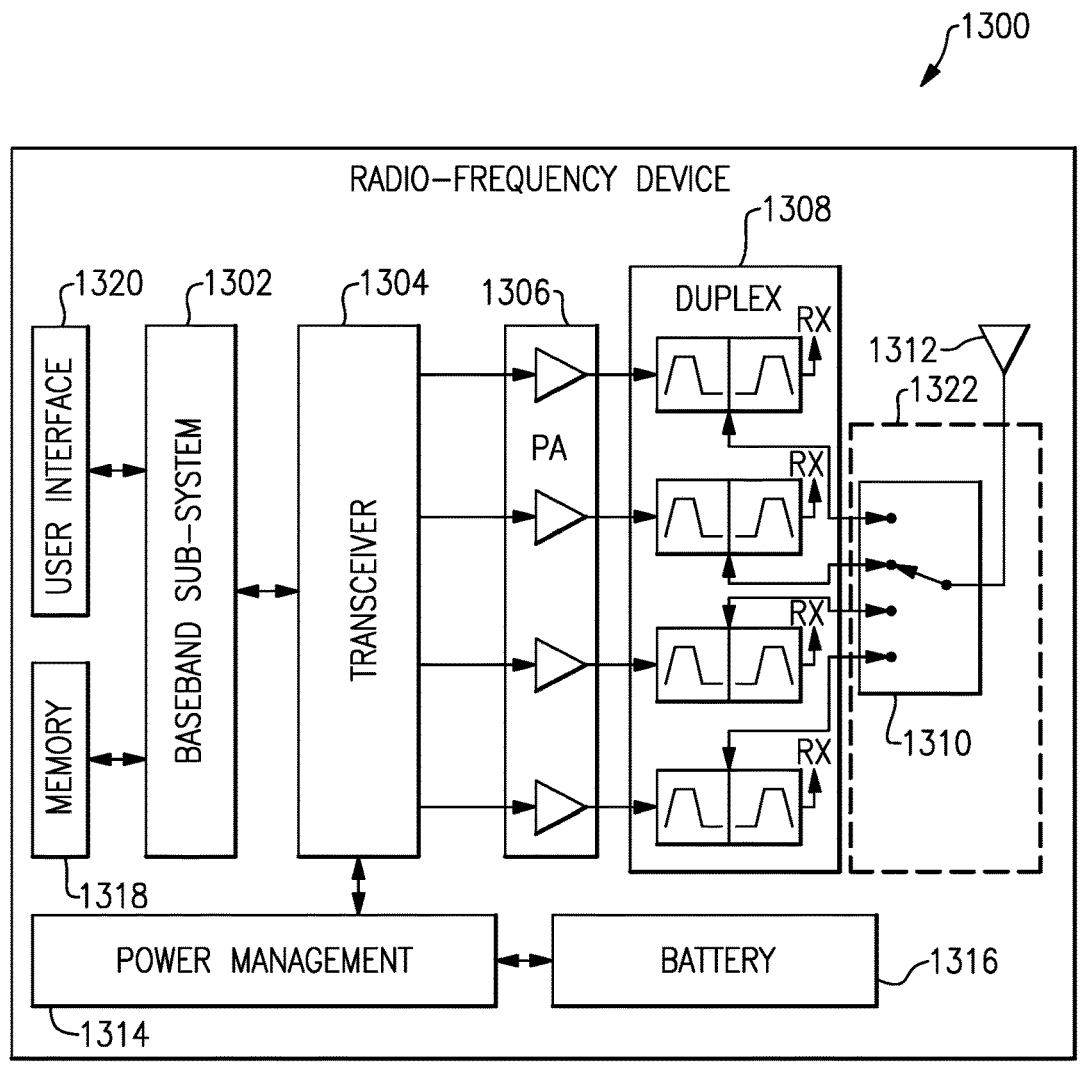
FIG. 13 illustrates an example radio-frequency device in accordance with one or more embodiments.

FIG. 13 illustrates an example radio-frequency device 1300. As shown, the radio-frequency device 1300 can include a baseband sub-system 1302, a transceiver 1304, a power amplifier (PA) module 1306, a duplexer 1308, a switch 1310, one or more antennas 1312, a power management system 1314, a battery 1316, a memory 1318, and a user interface 1320. The baseband sub-system 1302, the transceiver 1304, the PA module 1306, the duplexer 1308, the switch 1310, one or more antennas 1312, the power management system 1314, the battery 1316, the memory 1318, and/or the user interface 1320 can be in communication with each other.

The baseband sub-system 1302 can be connected to the user interface 1320 to facilitate various input and/or output of voice and/or data provided to and/or received from a user. The baseband sub-system 1302 can also be connected to the memory 1318 that is configured to store data and/or instructions to facilitate operation of the radio-frequency device 1300 and/or to provide storage of information for a user.

The transceiver 1304 can generate radio-frequency (RF) signals for transmission and/or process incoming RF signals received from the one or more antennas 1312. The transceiver 1304 can interact with the baseband sub-system 1302 that is configured to provide conversion between data and/or voice signals suitable for a user and/or RF signals suitable for the transceiver 1304. The transceiver 1304 can also be connected to the power management system 1314.

The PA module 1306 can include a plurality of PAs that can provide an amplified RF signal to the switch 1310 (e.g., via the duplexer 1308). The PA module 1306 can also receive an unamplified RF signal from the transceiver 1304. In examples, the duplexer 1308 can allow transmit and/or receive operations to be performed simultaneously using a common antenna. In FIG. 13, received signals are shown to be routed to "Rx" paths that can include, for example, a low-noise amplifier (LNA).

The switch 1310 can route an RF signal to and/or from the one or more antennas 1312. The switch 1310 can include any number of poles and/or throws. The switch 1310 can be implemented as any of the switches discussed herein. In examples, the switch 1310 is implemented on a module 1322. The module 1322 can include a packaging substrate configured to receive a plurality of components. Although one switch 1310 is illustrated in the example of FIG. 13, any number of switches can be implemented on the radio-frequency device 1300.

The one or more antennas 1312 can include antennas for transmitting and/or receiving signals associated with a wide variety of frequencies and communications standards. In examples, the one or more antennas 1312 support Multiple-Input Multiple-output (MIMO) communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator. In examples, the one or more antennas 1312 can include a diversity antenna.

The power management system 1314 can be configured to manage power for operation of the radio-frequency device 1300. The power management system 1314 can provide power to any number of components of the radio-frequency device 1300. The power management system 1314 can receive a battery voltage from the battery 1316. The battery 1316 can be any suitable battery for use in the radio-frequency device 1300, including, for example, a lithium-ion battery.

The radio-frequency device 1300 can communicate using a wide variety of communications technologies, including, but not limited to, 2G, 3G, 4G (including Long Term Evolution (LTE), LTE-Advanced, and LTE-Advanced Pro), 5G NR, Wireless Local Area Network (WLAN) (for instance, Wi-Fi), Wireless Personal Area Network (WPAN) (for instance, Bluetooth and ZigBee), Wireless Metropolitan Area Network (WMAN) (for instance, WiMax), and/or satellite-based radio navigation systems (for instance, Global Positioning System (GPS) technologies).

The radio-frequency device 1300 can operate with beam-forming in certain implementations. For example, the radio-frequency device 1300 can include phase shifters having variable phase controlled by the transceiver 1304. Additionally, the phase shifters are controlled to provide beam formation and directivity for transmission and/or reception of signals using the one or more antennas 1312. For example, in the context of signal transmission, the phases of the transmit signals provided to the one or more antennas 1312 are controlled such that radiated signals from the one or more antennas 1312 combine using constructive and destructive interference to generate an aggregate transmit signal exhibiting beam-like qualities with more signal strength propagating in a given direction. In the context of signal reception, the phases are controlled such that more signal energy is received when the signal is arriving to the one or more antennas 1312 from a particular direction. In certain implementations, the one or more antennas 1312 include one or more arrays of antenna elements to enhance beamforming.

In examples, the radio-frequency device 1300 supports carrier aggregation, thereby providing flexibility to increase peak data rates. Carrier aggregation can be used for both Frequency Division Duplexing (FDD) and Time Division Duplexing (TDD), and can be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The radio-frequency device 1300 can include a wide variety of devices that are configured to communicate wirelessly. For example, the radio-frequency device 1300 can include a cellular phone, a smart-phone, a hand-held wireless device with or without phone functionality, a wireless tablet, a smart appliance, a smart vehicle, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wearable device (e.g., a watch), a clock, etc.

The detailed description is set forth with reference to the accompanying figures. In the figures, the left-most digit(s) of a reference number identifies the figure in which the reference number first appears. The use of the same reference numbers in different figures indicates similar or identical items.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Further, the word "connected" can refer to two or more elements that are either directly connected or connected by way of one or more intermediate elements. Components discussed herein can be coupled or connected in a variety of manners, such as through a conductive material. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above description of embodiments of the disclosure is not intended to be exhaustive or to limit the disclosure to the precise form disclosed above. While specific embodiments, and examples, are described above for illustrative purposes, various equivalent modifications are possible within the scope of the disclosure, as those skilled in the relevant art will recognize. For example, while processes or blocks may be presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The features described herein can be applied to other systems, not necessarily the system described above. The elements and acts of the various embodiments described above can be combined to provide further embodiments.

While some embodiments have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. Claims and their equivalents are intended to cover such forms or modifications as would fall within the scope and spirit of the disclosure.

What is claimed is:

1. A radio-frequency switch comprising:
a switch arm having a first transistor connected between an input node and an output node, the switch arm configured to selectively pass a radio-frequency signal from the input node to the output node; and
a linearizer arm having a second transistor that includes a first terminal connected to at least one of a gate or a body of the first transistor and without connecting to the input node and the output node, a second terminal connected to a ground node and without connecting to the input node and the output node, and a gate connected to a first biasing component, the linearizer arm including a resistor connected between the second transistor and the first transistor, the linearizer arm configured to compensate a non-linearity effect generated by the switch arm by generating a first third-order distortion product, the switch arm being configured to generate a second third-order distortion product that is substantially opposite in phase to the first third-order distortion product, each of the first terminal and the second terminal comprising a source, drain, emitter, or collector, the first biasing component being configured to provide voltage to bias the second transistor, a width of the gate of the first transistor is larger than 1 mm and a width of the gate of the second transistor is smaller than 10 µm.

2. The radio-frequency switch of claim 1 wherein the first transistor includes a plurality of transistors connected in series to form a stack, and the linearizer arm is connected to each of the plurality of transistors.

3. The radio-frequency switch of claim 2 wherein the plurality of transistors includes at least ten transistors.

4. The radio-frequency switch of claim 2 wherein the width of the gate of the first transistor is based at least in part on a number of the plurality of transistors in the stack.

5. The radio-frequency switch of claim 1 wherein the resistor has a resistance that is larger than a threshold.

6. The radio-frequency switch of claim 1 wherein the linearizer arm is connected to the gate of the first transistor.

7. The radio-frequency switch of claim 6 wherein the linearizer arm includes (i) the first biasing component and (ii) a second biasing component connected to a source of the second transistor, the linearizer arm being configured to control the first transistor to enable or disable passage of the radio-frequency signal from the input node to the output node.

8. The radio-frequency switch of claim 6 wherein the linearizer arm is configured to control the first transistor to enable or disable passage of the radio-frequency signal from the input node to the output node.

9. The radio-frequency switch of claim 8 wherein the linearizer arm is configured to enable passage of the radio-frequency signal from the input node to the output node by controlling the second transistor to be in an on state.

10. The radio-frequency switch of claim 8 wherein the linearizer arm is configured to disable passage of the radio-frequency signal from the input node to the output node by controlling the second transistor to be in an off state.

11. The radio-frequency switch of claim 1 wherein the linearizer arm is connected to the body of the first transistor.

12. The radio-frequency switch of claim 1 wherein the first transistor and the second transistor are each implemented as a field-effect transistor.

13. A radio-frequency switch comprising:
an input node and an output node;
a signal path including a first transistor connected between the input node and the output node, the first transistor being controllable to enable or disable passage of a radio-frequency signal from the input node to the output node; and
a linearizer arm including a second transistor that includes a first element connected to at least one of a gate or a body of the first transistor and without being connected to the first transistor in another manner, a second element connected to a ground node, and a gate connected to a biasing component, the first element being a source, drain, emitter, or collector, the linearizer arm being configured to compensate a non-linear effect by generating a first third-order distortion product that is substantially opposite in phase to a second third-order distortion product that is generated by the signal path, the biasing component being configured to provide voltage to bias the second transistor, a width of the gate of the first transistor is larger than 1 mm and a width of the gate of the second transistor is smaller than 10 µm.

14. The radio-frequency switch of claim 13 wherein the linearizer arm is connected to the gate of the first transistor and the linearizer arm is configured to control the first transistor to enable or disable passage of the radio-frequency signal from the input node to the output node.

15. The radio-frequency switch of claim 13 wherein the first transistor includes a plurality of transistors connected in series to form a stack, and the linearizer arm is connected to each of the plurality of transistors.

16. The radio-frequency switch of claim 13 wherein the linearizer arm is connected to the gate of the first transistor.

17. A radio-frequency module comprising:
a packaging substrate to receive a plurality of components; and
a semiconductor die mounted on the packaging substrate, the semiconductor die including a radio-frequency switch having a switch arm and a linearizer arm, the switch arm having a first transistor connected between an input node and an output node, the switch arm configured to selectively pass a radio-frequency signal from the input node to the output node, the linearizer arm having a second transistor that includes a first element connected to at least one of a gate or a body of the first transistor and without being connected to the first transistor in another manner, a second element connected to a ground node, and a gate connected to a biasing component, the first element being a source, drain, emitter, or collector, the linearizer arm configured to compensate a non-linearity effect generated by the switch arm by generating a first third-order distortion product, the switch arm being configured to generate a second third-order distortion product that is substantially opposite in phase to the first third-order distortion product, a width of the gate of the first transistor is larger than 1 mm and a width of the gate of the second transistor is smaller than 10 µm.

18. The radio-frequency switch of claim 1 wherein the linearizer arm is configured to reduce third-order distortion by more than 25 dBm while substantially maintaining a signal strength of the radio-frequency signal.

19. The radio-frequency module of claim 17 wherein the first transistor includes a plurality of transistors connected in series to form a stack, and the linearizer arm is connected to each of the plurality of transistors.

20. The radio-frequency module of claim 17 wherein the linearizer arm is connected to the gate of the first transistor.

* * * * *